March 27, 1973 R. B. LIEBERT ET AL 3,723,278

METHOD OF DEPOSITING HAFNIUM-TANTALUM NITRIDE LAYER BY REACTIVE SPUTTERING

Filed July 30, 1971 5 Sheets-Sheet 1

INVENTOR.
RICHARD B. LIEBERT
THOMAS H. CONKLIN

BY

AGENT

March 27, 1973 R. B. LIEBERT ET AL 3,723,278

METHOD OF DEPOSITING HAFNIUM-TANTALUM NITRIDE LAYER BY REACTIVE SPUTTERING

Filed July 30, 1971 5 Sheets-Sheet 2

INVENTORS.
RICHARD B. LIEBERT
THOMAS H. CONKLIN

BY [signature]

AGENT

*INVENTORS.*
RICHARD B. LIEBERT
THOMAS H. CONKLIN

*BY* Frank R. Trifari
AGENT

INVENTORS.
RICHARD B. LIEBERT
THOMAS H. CONKLIN

BY

AGENT

*INVENTORS.*
RICHARD B. LIEBERT
THOMAS H. CONKLIN
*BY* Frank R. Trifari
AGENT

United States Patent Office 3,723,278

Patented Mar. 27, 1973

3,723,278

METHOD OF DEPOSITING HAFNIUM-TANTALUM NITRIDE LAYER BY REACTIVE SPUTTERING

Richard B. Liebert and Thomas H. Conklin, Ridgefield, Conn., assignors to North American Philips Corporation, New York, N.Y.

Filed July 30, 1971, Ser. No. 167,633
Int. Cl. C23c *15/00*
U.S. Cl. 204—192 2 Claims

ABSTRACT OF THE DISCLOSURE

A hafnium-tantalum nitride layer having a composition between the mononitride and the dinitride 500–5000 A. thick is deposited on an oxidized silicon substrate in an argon atmosphere containing nitrogen at a partial pressure of $5–10\times10^{-3}$ torr by RF sputtering of hafnium mononitride and tantalum mononitride. After subsequent annealing such layers have sheet resistivities of at least $2\times10^{13}$ ohms/□ and are particularly suited as an electron discharge layer on the oxide surface of a silicon vidicon target wafer, i.e. as a resistive sea.

The invention relates to a method of depositing a hafnium-tantalum nitride layer having a composition between the mononitride and the dinitride on a substrate, in particular a silicon or silicon oxide substrate, and especially to an electron discharge layer on the oxide surface of a silicon vidicon target wafer, more usually referred to as a resistive sea.

As is well-known, a silicon vidicon target comprises a silicon wafer having a large number of separated diodes formed therein by silicon of different conductivities, i.e. p- and n-type conductivities, and between the diodes the silicon layer is covered by an oxide layer which can accumulate charge when the surface of the layer is scanned in a camera tube. In order to remove charge which normally accumulates on the oxide between the diodes, a layer of material is deposited with a sheet resistivity of $10^{12}$ to $10^{15}$ ohms/□.

In order to avoid some of the difficulties associated with the deposition and use of materials commonly employed for this purpose, the use of hafnium-tantalum dinitride ($HfN_2/TaN_2$) has been suggested. The preparation of such a layer by reactive sputtering has also been suggested (ECS Abstract No. 89, October 1969, pp. 249–250). In the disclosed method hafnium and tantalum dinitrides are deposited by RF+DC reactive sputtering of hafnium and tantalum metals in an undiluted nitrogen atmosphere.

It is a principal object of our invention to provide a method of depositing hafnium-tantalum nitride layers which are especially suited as an electron discharge layer on the oxide surface of a silicon vidicon target wafer.

A further object of our invention is to provide hafnium-tantalum nitride layers which have a sheet resistivity between $2\times10^{13}$ and $10^{15}$ ohms/□.

A still further object of our invention is to provide a hafnium-tantalum nitride layer on a substrate which protects the substrate from the action of X-rays.

Another object of our invention is to provide a hafnium-tantalum nitride layer on the oxide surface of a silicon vidicon target wafer which increases the life of the target.

These and further objects of the invention will appear as the specification progresses.

In accordance with the invention a layer of hafnium and tantalum nitrides having a composition between the nononitride and the dinitride is deposited on an oxidized silicon substrate by radio-frequency reactive sputtering in the diode mode of hafnium mononitride and tantalum mononitride in an argon atmosphere containing nitrogen at a partial pressure of $5–10\times10^{-3}$ torr.

The invention will be described with reference to the accompanying drawing in which.

Figure 1:
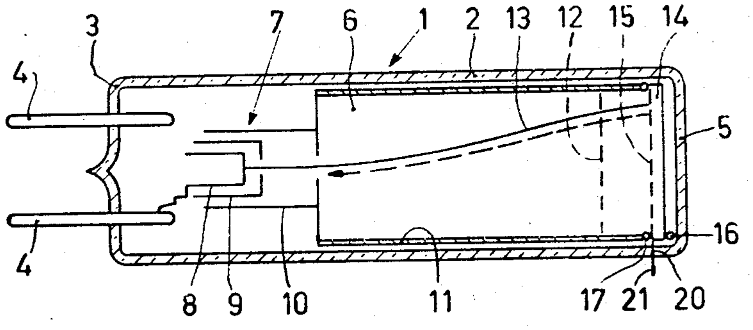
FIG. 1 is a camera tube employing a silicon target with a large number of diodes.
Figure 2:
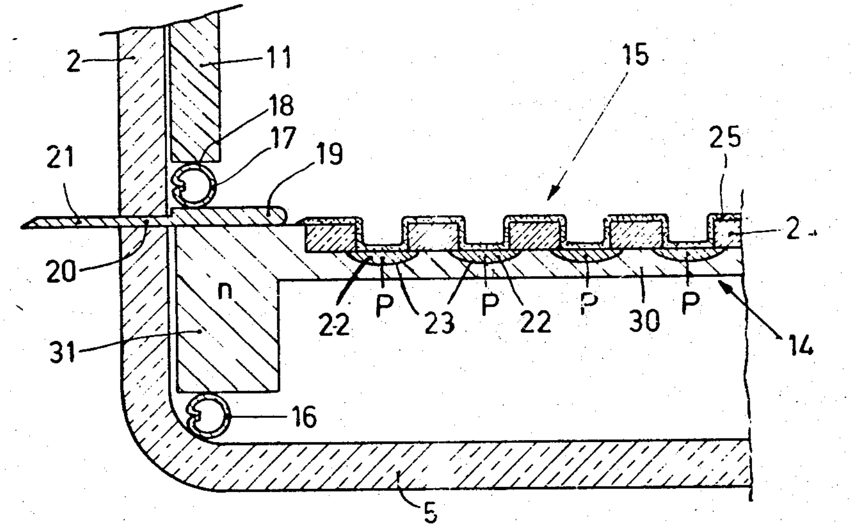
FIG. 2 is a sectional view of the target on an enlarged scale.

The camera tube of FIG. 1 is for the major part of the construction of the known vidicon camera tubes. An elongated, cylindrical envelope 1 having a glass sheath 2 encloses an exhausted space 6 and end face 3 having various through-connections 4 and a second end face 5 serving as an input window for the image information light. This space accommodates an electron gun 7, a cathode 8, a control-grid 9 and an anode 10. The tube comprises furthermore a cylindrical electrode 11, electrically connnected to the anode 10 and supporting a gauze electrode 12 at the end remote from the cathode. The photo-sensitive target plate 14 is scanned by the electron beam 13, produced by said electrode system, with the aid of conventional focusing and deflecting coils (not shown in the figure) surrounding the tube, which coils may be replaced by electrodes (not shown) inside the tube for electrostatic focusing and deflection. The target plate 14, to be described more fully hereinafter with reference to FIG. 2, is mounted in the envelope 1 by clamping its rim between a resilient mounting ring 16, which is in contact both with the input window 5 and the sheath 2 and a second resilient ring 17, which is in contact with the sheath and an end 18 of the electrode 11. The target plate 14, formed by a round disc, is concave on the side facing the window 5 so that the central portion of the disc forms a plate 30 of about 10μ in thickness. A metal ring 19, which serves for the electric connection, is clamped between the thicker annular circumferential part 31 of the disc 14 and one of the electrically insulating rings 16 or 17. The ring 19 is connected to an electric conductor 20 passed through the wall 2. On the side facing the electron gun 7 the target plate of semiconductor material, in this case silicon, has a mosaic 15, extending up to the portion 30 and formed by domains 22 in a regular array. The material of these domains has a conductivity type opposite that of the material of the further portion (to be termed substrate hereinafter) of the disc 14. The domains 22 may be circular or square and may have a diameter or a side of about 20μ, the central distance between them being about 25μ. The domains form a rectifying junction 23 at a small depth in the substrate. These junctions have to operate in the reverse direction when the tube is operating. When scanned by slow electrons the domains 22 have therefore to be p-conducting and the substrate has to be n-conducting.

The side of the target plate 14 provided with the mosaic 21 has an electrically insulating layer 24. This layer does not cover the surfaces of the domains 22 and the thickened rim 31. The insulating layer having a thickness of about 0.5 to 1.0μ preferably consists of an oxide of the semiconductor material of the target plate and in the present case of silica obtained by oxidizing the central portion 30 of the silicon plate. In practice this layer is employed as a mask for establishing the p-conductive domains 22. The silicon substrate covered by the perforated layer 24 is for this end exposed to a dopant, for example, boron so that the apertures in the oxide layer of the silicon becomes p-conducting to a depth of about 2μ, the pn-junctions 23 with the substrate being thus formed.

A resistance layer 25 covers the insulating layer 24 and the domains 22. This layer consists of hafnium-tantalum nitride and it has a thickness of about 2000 A. or less and an electrical resistance of about $2\times10^{13}$ ohms/square.

This resistive layer was deposited by radio-frequency reactive sputtering in the diode mode from a source composed of 50 weight percent hafnium mononitride (HfN) and 50 weight percent tantalum mononitride. (TaN). The metal mononitrides were chosen to avoid the metallurgical difficulties of preparing a homogeneous metal target and to prevent nitrogen-metal reactions at the metal source surface during sputtering. Radio-frequency sputtering was used because of the poor conductivity of the HfN/TaN sputtering source. The diode mode was chosen for convenience but RF triode or bias sputtering could have been used. Reactive sputtering allows control of the nitrogen content of the deposited film. The sputtering atmosphere was argon containing undiluted high-purity dry nitrogen at a partial pressure of $8.5\times10^{-3}$ torr. Following deposition, the silicon vidicon target wafers were annealed for 10 minutes in an argon atmosphere at 400° C.

Figure 3:
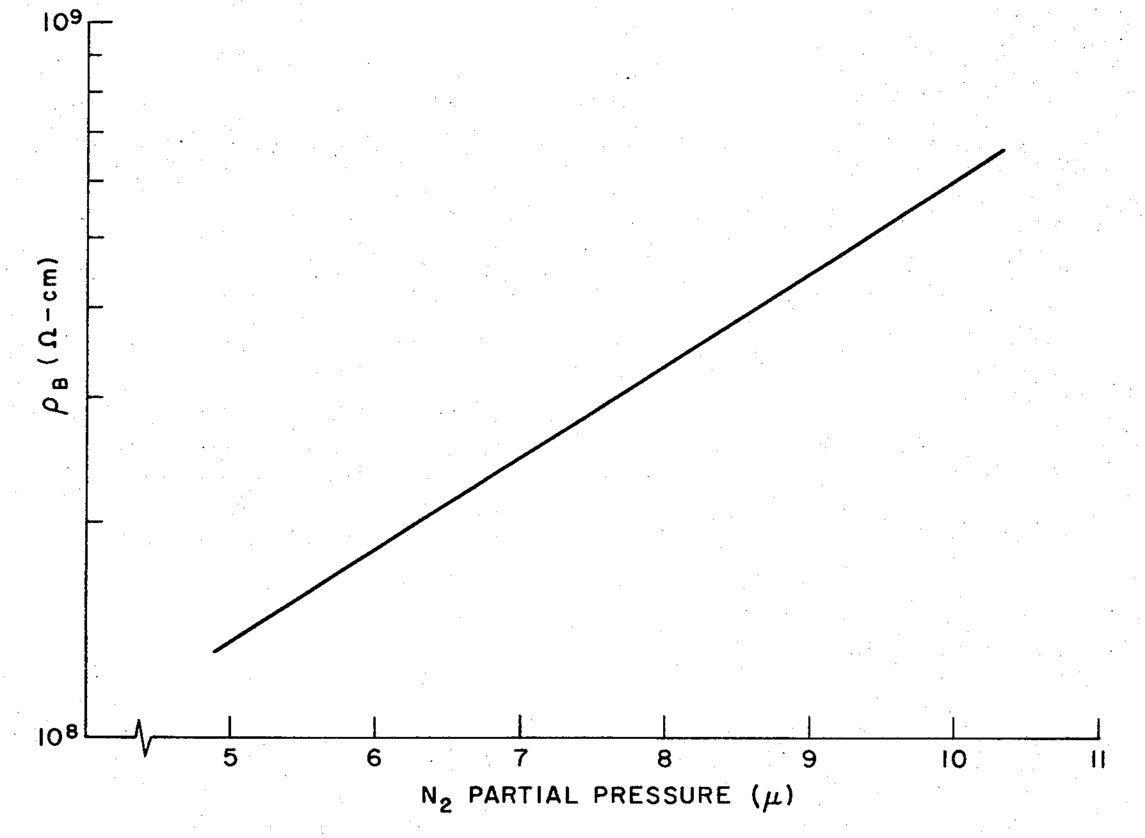
FIGS. 3 and 4 are graphs showing the relationship between the nitrogen pressure and resistivity; and, FIGS. 5 and 6 are graphs showing the relationship between the dark current and the annealing temperature.
Figure 4:
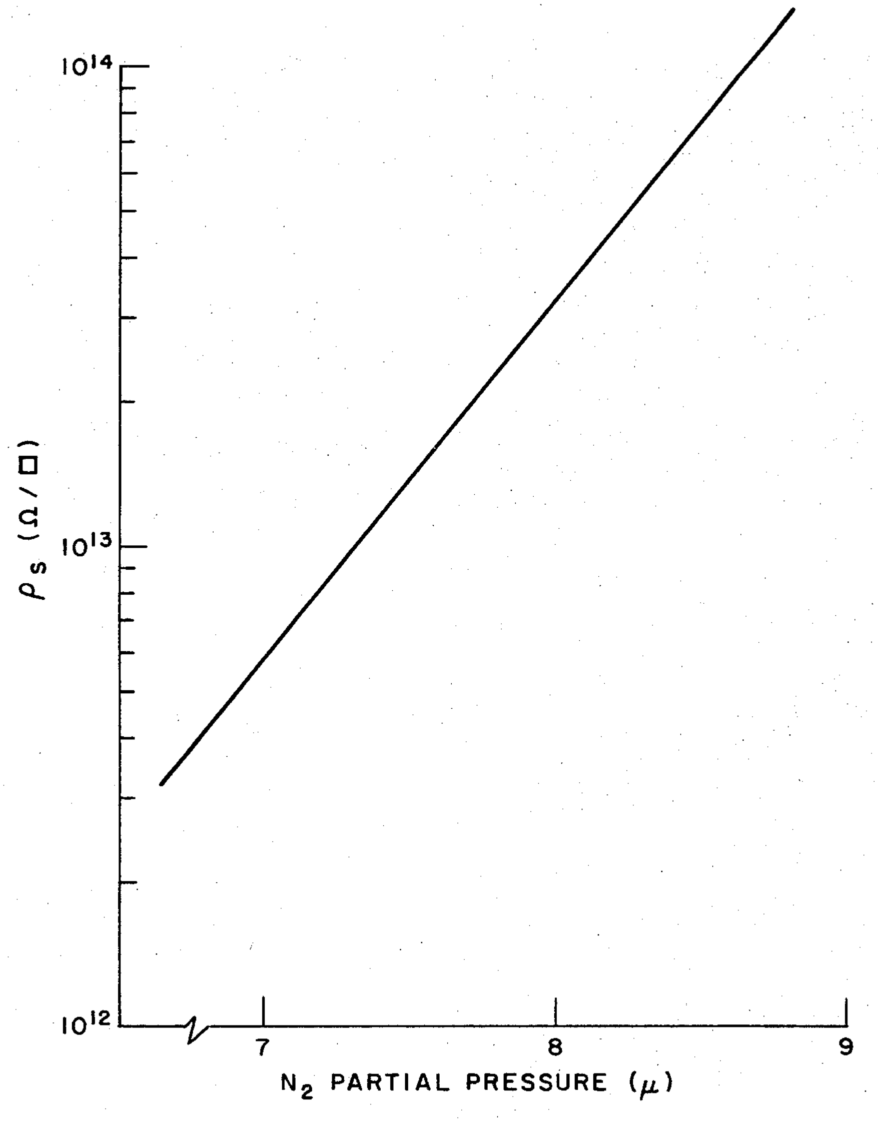

The resistivity can be adjusted to the desired value by maintaining the nitrogen partial pressure in the argon sputtering ambient at the desired value during deposition. FIG. 3 shows the variation of bulk resistivity with nitrogen partial pressure on monitor samples. FIG. 4 illustrates the dependence of sheet resistivity on nitrogen partial pressure for silicon vidicon target wafers evaluated in tubes.

Figure 5:
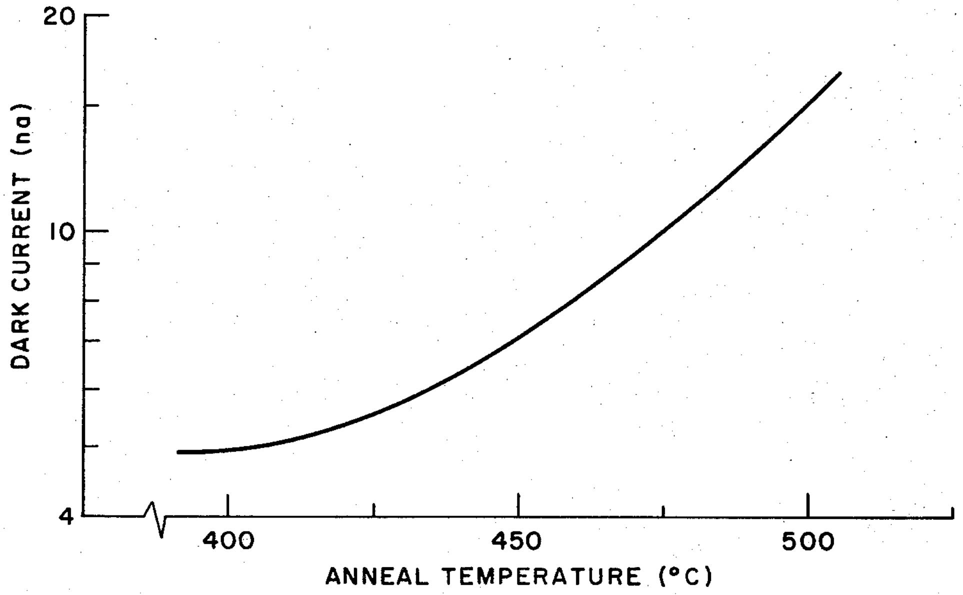
Figure 6:
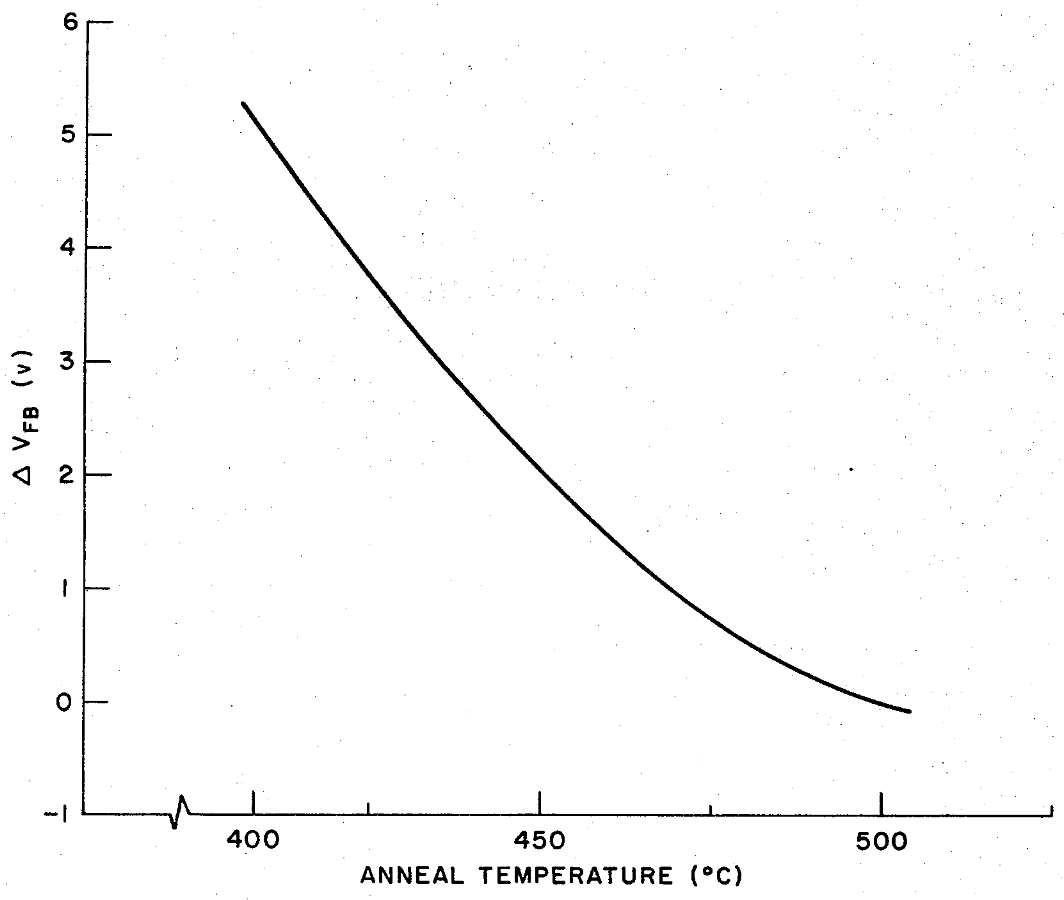

During the deposition of the hafnium nitride-tantalum nitride layer the silicon vidicon target wafer is subjected to bombardment by energetic electrons and neutral atoms, negative ions, X-rays and ultra-violet radiation. The result is a shift toward positive voltage in the flat band voltage ($V_{FB}$) and an increase in the leakage current (tube dark current) of the diodes. Low leakage currents and desired $V_{FB}$ in the finished target can be obtained by post-deposition anneals. FIG. 5 shows the effect of anneal temperature on dark current when an argon ambient is used for ten minutes. The effect of the annealing temperature on the difference between the initial and final flat band voltages is shown in FIG. 6.

It has been experimentally determined that the difference between the initial and final flat band voltage is a constant for a given annealing temperature. Thus, by choosing the appropriate target processing conditions prior to the deposition of the hafnium nitride-tantalum nitride layers (particularly pre-deposition anneals), it is possible to construct diode arrays with a resistive layer of hafnium nitride-tantalum nitride having optimum flat band and low leakage in the finished silicon vidicon tubes.

It has also been found that a camera tube employing a silicon mosaic target covered with a resistive sea of a layer of the hafnium and tantalum nitride in accordance with the invention is protected against the damaging effects of X-rays generated in the tube and has a longer life, i.e. at least 2000 hours.

The composition of the layer has been determined by electron microscope photographs which show the layer to be essentially a layer of tantalum and hafnium nitrides having a composition between the mononitride and the dinitride.

What is claimed is:

1. A method of forming a resistive layer having a sheet resistivity of about $2\times10^{13}$–$10^{15}$ ohms per square, on a target wafer comprising the steps of providing a target wafer of a semi-conductive substrate provided with a mosaic of domains each of which forms a rectifying junction with the semi-conductor substrate and depositing a layer of tantalum and hafnium nitrides having a composition between the mononitride and the dinitride by RF reactive sputtering of hafnium and tantalum mononitrides in an argon atmosphere containing nitrogen at a partial pressure between 5 to $10\times10^{-3}$ torr.

2. A method as claimed in claim 1 in which the layer is subsequently annealed at a temperature of about 400–500° C.

References Cited

UNITED STATES PATENTS

| | | | |
|---|---|---|---|
| 3,627,662 | 12/1971 | Feversanger | 204—192 |
| 3,647,662 | 3/1972 | Gerstenberg et al. | 204—192 |
| 3,663,408 | 5/1972 | Kumagai et al. | 204—192 |

JOHN H. MACK, Primary Examiner

S. S. KANTER, Assistant Examiner

U.S. Cl. X.R.

117—123 A